United States Patent [19]

Takahashi

[11] 4,370,736

[45] Jan. 25, 1983

[54] TERMINATION CIRCUIT FOR WORD LINES OF A SEMICONDUCTOR MEMORY DEVICE

[75] Inventor: Yukio Takahashi, Shiga, Japan

[73] Assignee: Fujitsu Limited, Kawasaki, Japan

[21] Appl. No.: 182,670

[22] Filed: Aug. 29, 1980

[30] Foreign Application Priority Data

Aug. 30, 1979 [JP] Japan ................... 54-110720

[51] Int. Cl.³ ................. G11C 11/40; G11C 7/00
[52] U.S. Cl. .................. 365/155; 365/179; 365/190
[58] Field of Search ............. 365/155, 190, 203, 179

[56] References Cited

U.S. PATENT DOCUMENTS 4,156,941  5/1979  Homma et al. ............... 365/189
4,164,791  8/1979  Homma ........................ 365/155
4,168,539  9/1979  Anderson ..................... 365/155

OTHER PUBLICATIONS

Inadachi et al., "A 6ns 4kb Bipolar RAM Using Switched Load Resistor Memory Cell", ISSCC Digest of Technical Papers, Feb. 15, 1979, p. 108.
Buerker et al., "An ECL 100K Compatible 1024×4b RAM with 15ns Access Time", ISSCC Digest of Technical Papers, Feb. 15, 1979, p. 102.

Primary Examiner—James W. Moffitt
Attorney, Agent, or Firm—Staas & Halsey

[57] ABSTRACT

A termination circuit for word lines of a static semiconductor memory device comprising, for each word line, a first transistor which detects a potential change on the word line, a delay circuit which delays an output signal from the first transistor by a predetermined time period and a second transistor which is turned on and off by an output signal from the delay circuit. Each of the second transistors is connected between one of the hold lines and a common hold current source, so that the second transistors and the common hold current source forming a current switch.

10 Claims, 6 Drawing Figures

TERMINATION CIRCUIT FOR WORD LINES OF A SEMICONDUCTOR MEMORY DEVICE

BACKGROUND OF THE INVENTION (1) Field of the Invention

The present invention relates to a termination circuit for the word lines of a semiconductor memory device, more particularly to a termination circuit which can reduce both the rise time and the fall time for a word selection signal applied to the word lines.

(2) Description of the Prior Art

In general, it is necessary to decrease both the power consumption of each memory cell and the size of each memory cell in order to increase the capacity of a semiconductor memory device. One of the methods for decreasing the power consumption of each of the memory cells is to increase the resistance value of the load resistors of each of the memory cells so that the holding current passing through non-selected word lines is decreased. However, increasing the resistance value of the load resistors leads to an increase in the transition time from a selected condition to a non-selected condition, because the fall time of the word selection signal is increased. Consequently, the desired high speed operation of the memory device can not be attained.

In order to decrease the fall time of the word selection signal applied to a word line, a conventional memory device, as disclosed in the thesis "AN ECL 100 K Compatible 1024×4b RAM with 15 ns Access Time", by Ulf Buerker, et al., ISSCC DIGEST OF TECHNICAL PAPERS, Feb. 15, 1979, p. 102, includes a termination circuit as illustrated in FIG. 1.

In FIG. 1, a memory cell array MCA composed of a plurality of memory cells $MC_{ij}$ ($i=1,2,\ldots,n; j=1,2,\ldots,m$) whose matrix is n rows by m columns is illustrated. Each of the memory cells $MC_{ij}$ is a well known flip-flop type cell. The memory cell, for example $MC_{11}$, includes two multiemitter transistors $T_1$ and $T_2$, two load resisters $R_1$ and $R_2$, and two diodes $D_1$ and $D_2$, which are connected parallel to the load resisters $R_1$ and $R_2$, respectively. One of the emitter electrodes of the multiemitter transistor $T_1$ is connected to a hold line $HL_1$ and the other emitter electode of the multiemitter transistor $T_1$ is connected to a bit line $B_1$. One of the emitter electrodes of the multiemitter transistor $T_2$ is connected to the hold line $HL_1$ and the other emitter electrode of the multiemitter transistor $T_2$ is connected to a bit line $\overline{B_1}$. The word lines $WL_1, WL_2, \ldots, WL_n$ are connected to word line drivers $WD_1, WD_2, \ldots, WD_n$ respectively. The hold lines $HL_1, HL_2, \ldots, HL_n$ are connected to hold current sources $1_1, 1_2, \ldots, 1_n$ respectively. The hole lines $HL_1, HL_2, \ldots, HL_n$ are also connected to the anode electrode of diodes $D_{11}, D_{12}, \ldots, D_{1n}$, respectively, of a termination circuit 1, and the cathode electrodes of the diodes $D_{11}, D_{12}, \ldots, D_{1n}$ are commonly connected to an additional current source 10.

One of the memory cells $MC_{ij}$, for example the memory cell $MC_{11}$, is selected by applying a high potential word selection signal to the word driver $WD_1$ and a high potential bit selection signal to a bit line driver connected to the bit line pair $B_1$ and $\overline{B_1}$, not shown in FIG. 1. Therefore, the potential of the selected word line is high and the potentials of the non-selected word lines are low. The potential of the hold line is lower than the corresponding word line by a nearly constant value, i.e., the base-emitter voltage of one of the transistors in the memory cell.

The termination circuit 1 of the memory device of FIG. 1 helps to reduce the fall time of the potential of the word line, for example $WL_1$, whenever the word line changes its state from the selected condition to the non-selected condition, by adding the current $\Delta I_H$ to the current $I_H$ flowing from the selected word line $WL_1$ through the memory cells $MC_{11}, \ldots, MC_{1m}$ to the hold line $HL_1$. Since the potential level of the hold line $HL_1$, corresponding to the selected word line $WL_1$, is higher than that of the other hold lines $HL_2, \ldots, HL_n$, the diode $D_{11}$ connected to the selected hold line $HL_1$ is turned on and the current $\Delta I_H$ flows from the selected hold line $HL_1$ through the diode $D_{11}$ to the additional current source 10. Consequently, the potential level of the hold line $HL_1$ and, thus the potential level of the word line $WL_1$ falls quickly. The additional current $\Delta I_H$ serves to quickly discharge the electric charge stored in the stray capacitance included in the word line, the hold line and the memory cells connected between the word line and the hold line, so that the potential drop of the word line is accelerated.

In order to decrease the operation time of a memory device, for example, the read out time, it is necessary to quickly lower the output potential of a non-selected memory cell. This quick reduction of the output potential of a non-selected memory cell is necessary because a read out current flows from the non-selected memory cell to the bit line even when the potential level of the non-selected memory cell is high, and a read out from the next selected memory cell cannot begin before the potential level of the non-selected memory cell drops. The potential level of the non-selected memory cell does not fall quickly, even if the potential level of the word line falls quickly, because of stray capacitance contained in the memory cell. Therefore, as mentioned above, the potential of the memory cell is forced to drop to a low level by the additional current $\Delta I_H$ flowing from the memory cell through the hold line to the additional current source 10. It should be noted that the additional current flow is required temporarily during the transition period from the selected condition to the non-selected condition.

FIG. 2 illustrates graphically the relationship between the potential of two word lines, one which is, for example, the word line $WL_1$ which had been previously selected and which is changing its potential from high (selected condition) to low (non-selected condition); and the other word line which is, for example, the word line $WL_2$ which was selected after the word line $WL_1$ and which is changing its potential from low to high. The dotted lines in FIG. 2 illustrate the characteristics of the potential of the two word lines $WL_1$ and $WL_2$ when the termination circuit 1 of FIG. 1 is not used, and the solid lines illustrate the potential of the two word lines $WL_1$ and $WL_2$ when the termination circuit of FIG. 1 is used. As shown in FIG. 2, a cross point CP of the solid lines comes faster than a cross point CP′ of the dotted lines because of the termination circuit 1.

Although the termination circuit 1 can reduce the fall time of the potential of the word line, for example, $WL_1$ until the cross point CP is reached, the fall time after the cross point CP cannot be reduced. The further reduction cannot be accomplished because the additional current $\Delta I_H$ does not flow from the hold line $HL_1$ but flows from the hold line $HL_2$ to the additional current source 10 after the cross point CP has been reached. That is, among the diodes $D_{11}, D_{12}, \ldots, D_{1n}$ of the termination circuit 1, only the diode which is connected to the hold line having the highest potential turns on. Until the cross point CP is reached the diode $D_{11}$ is turned on and after the cross point CP is reached the diode $D_{12}$ is turned on. Therefore, until the cross point CP is reached, the additional current $\Delta I_H$ flows from the hold line $HL_1$, corresponding to the word line $WL_1$ which had been previously selected; and after the cross point CP, the additional current $\Delta I_H$ flows from the hold line $HL_2$, corresponding to the word line $WL_2$ which was selected subsequent to the word line $WL_1$, so that only the hold current $I_H$ flows through the hold line $HL_1$.

FIG. 3 illustrates other conventional termination circuits $2_1, 2_2, \ldots, 2_n$, as disclosed in the thesis "A 6 ns 4 Kb Bipolar RAM using Switched Load Resistor Memory Cell", by Masaaki Inadachi, et al., ISSCC DIGEST OF TECHNICAL PAPERS, Feb. 15, 1979, p. 108. The termination circuit, for example, $2_1$ reduces the fall time for the potential level of the word line $WL_1$ by delaying the trailing edge of the word selection signal on the word line $WL_1$ and not delaying the leading edge of the word selection signal on the word line $WL_2$, so that the additional current $\Delta I_H$ flows from the hold line $HL_1$, corresponding to the word line $WL_1$, to the current source $\Delta I_H$ until the potential level of the word line $WL_1$ falls to a substantially low level, even after the word line $WL_1$ has changed its state from the selected condition to the non-selected condition.

One of the termination circuits $2_1, 2_2, \ldots, 2_n$ of FIG. 3, for example, the termination circuit $2_1$, includes an NPN type transistor $T_{31}$. The collector electrode of transistor $T_{31}$ is connected to the word line $WL_1$ through a resistor $R_{31}$ and a capacitor $C_{31}$ connected in parallel and, the emitter electrode is connected to a negative voltage source line NL through a resistor $R_{33}$ and the base electrode is connected to a reference voltage source $V_{REF}$ having a constant voltage, causing the transistor $T_{31}$ to operate as a constant current source. The termination circuit $2_1$ also includes an NPN type transistor $T_{32}$, the base electrode of transistor $T_{32}$ is connected to the collector electrode (point A) of the transistor $T_{31}$, the collector electrode is connected to the ground and the emitter electrode is connected to the negative voltage source line NL through a resistor $R_{32}$ and a capacitor $C_{32}$ connected in parallel. The termination circuit $2_1$ further includes an NPN type transistor $T_{33}$, the base electrode of transistor $T_{33}$ is connected to the emitter electrode (point B) of the transistor $T_{32}$, the collector electrode of transistor $T_{33}$ is connected to the hold line $HL_1$ and the emitter electrode is connected to the negative voltage source line NL through a resistor $R_{34}$.

In the termination circuit $2_1$ of FIG. 3, the potential of point A rises substantially at the same time as the potential rise of the word line $WL_1$, due to the action of the capacitor $C_{31}$, and the potential of the point B, which is lower than that of point A by the base-emitter voltage $V_{BE}$ of the transistor $T_{32}$, also rises at substantially the same time as the potential rise of the word line $WL_1$. Therefore, transistor $T_{33}$ turns on immediately after the potential rise of the selected word line $WL_1$, and the additional current $\Delta I_H$ flows from the hold line $HL_1$ through the transistor $T_{33}$ and the resistor $R_{34}$ to the negative voltage source line NL. When the potential of the word line $WL_1$ drops, due to the transition from the selected condition to the non-selected condition, the potential of the point B does not fall immediately but falls slowly, due to the action of the capacitor $C_{32}$, so that the transistor $T_{33}$ does not turn off immediately after the drop of the potential of the word line $WL_1$ but continues in a turned on condition for a short time. Therefore, as shown in FIG. 4, the additional current $\Delta I_H$ continues to flow through the hold line $HL_1$ for a predetermined time period $\Delta t$, even after the potential $V_W$ of the word line $WL_1$ has fallen from the high level (selected condition) to the low level (non-selected condition). Consequently, the fall time for the potential $V_W$ of the word line is reduced as shown by a solid line in FIG. 4. In FIG. 4, dotted lines show the characteristics of the potential $V_W$ of the word line and the additional current $\Delta I_H$ of the circuit of FIG. 1.

However, in the termination circuit $2_1$ of FIG. 3, the transistor $T_{33}$ turns on immediately after the potential rise of the word line $WL_1$ and the additional current $\Delta I_H$ flows immediately through the hold line $HL_1$, corresponding to the word line $WL_1$. Therefore, the load of the word line $WL_1$, i.e., the load on the word line driver $WD_1$, becomes heavy during the potential rise of the word line $WL_1$, causing the rise time for the potential $V_W$ of the word line $WL_1$ to be increased when the word line driver $WD_1$ does not have a large driving capability.

The termination circuits $2_1, 2_2, \ldots, 2_n$ of FIG. 3 also have the disadvantage that each of the termination circuits $2_1, 2_2, \ldots, 2_n$ of FIG. 3 uses many circuit parts, including two capacitors, for example, $C_{31}$ and $C_{32}$, so that the area occupied by each of the termination circuits $2_1, 2_2, \ldots, 2_n$ in an integrated circuit of a memory device becomes large. Another disadvantage is that a termination circuit $2_1, 2_2, \ldots, 2_{n-1}$ or $2_n$ is provided for each of the word lines of a memory device, and therefore, a memory device of, for example, 4 Kbits (64×64 bits), which has 64 word lines, needs 64 termination circuits, thus requiring a large area for the termination circuits.

SUMMARY OF THE INVENTION

It is an object of the present invention to reduce the rise time and the fall time for the potentials of word lines of a memory device as compared to the prior art.

It is another object of the present invention to provide a termination circuit consisting of a small number of circuit parts.

It is another object of the present invention to provide a termination circuit which does not occupy a large area in the integrated circuit of a memory device.

According to the present invention, there is provided a termination circuit for a static semiconductor memory device including, for each word line, a first transistor which detects potential change of a word line; a delay circuit which delays an output signal from the first transistor by a predetermined time period and a second transistor which is turned on and off by an output signal from the delay circuit, each of the second transistors being connected between one of the hold lines and a common hold current source, and the second transistors and the common hold current source composing a current switch.

DETAILED DESCRIPTION OF THE PREFERRED EMBODIMENT

Figure 1:
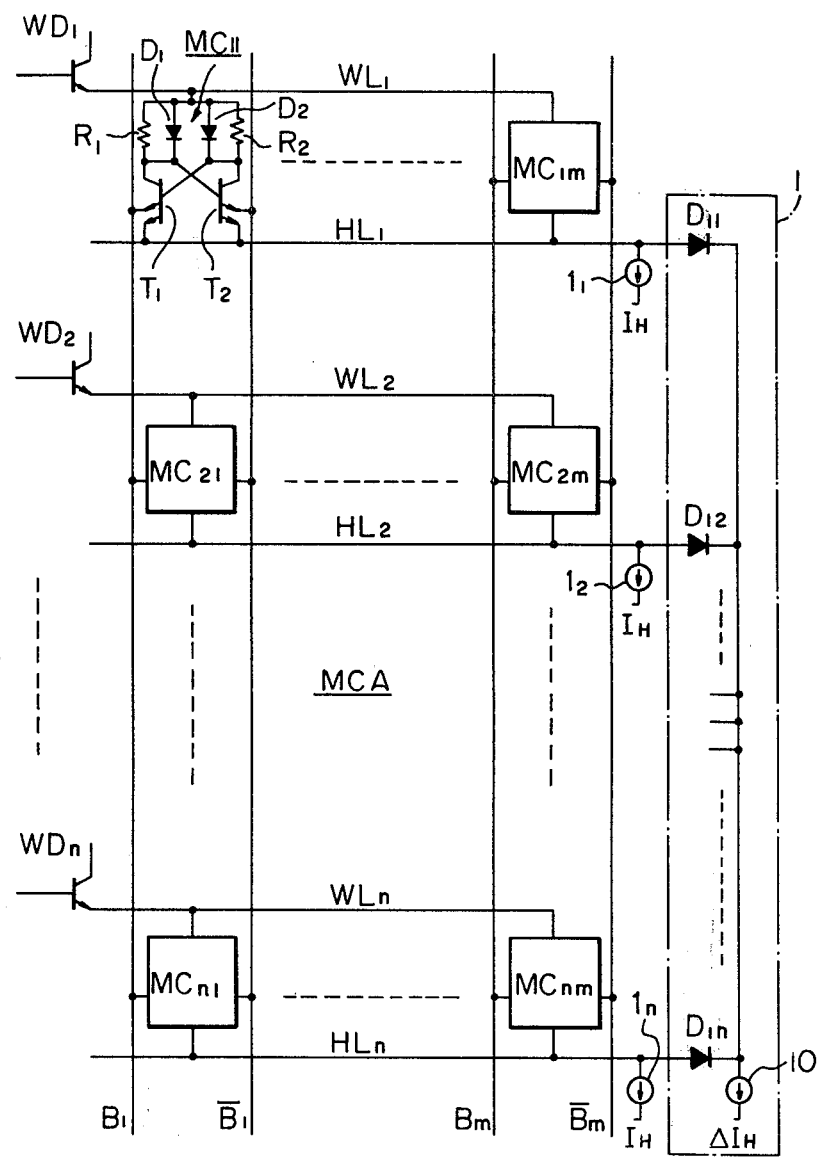
FIG. 1 is a block circuit diagram illustrating a memory device having a conventional termination circuit.
Figure 2:
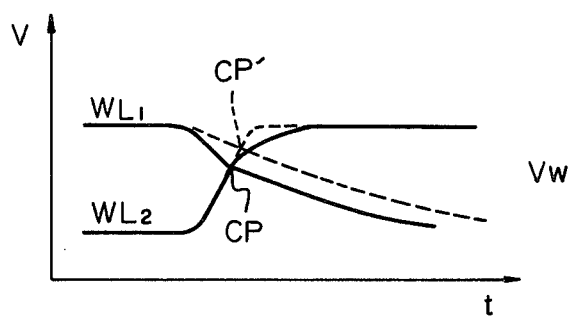
FIG. 2 is a timing diagram graphically illustrating the transition of the potentials of the word lines in the memory device of FIG. 1.
Figure 4:
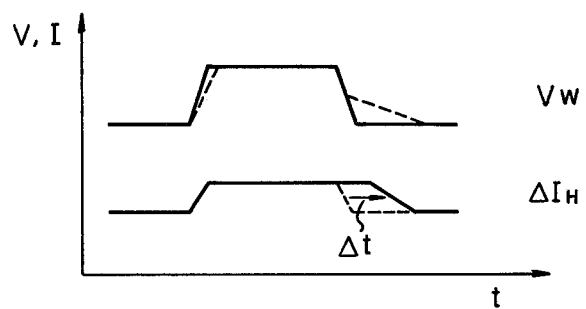
FIG. 4 is a timing diagram graphically illustrating the characteristics of a potential $V_W$ of a word line and the characteristics of an additional current $\Delta I_H$ in the memory device of FIG. 3.
Figure 3:
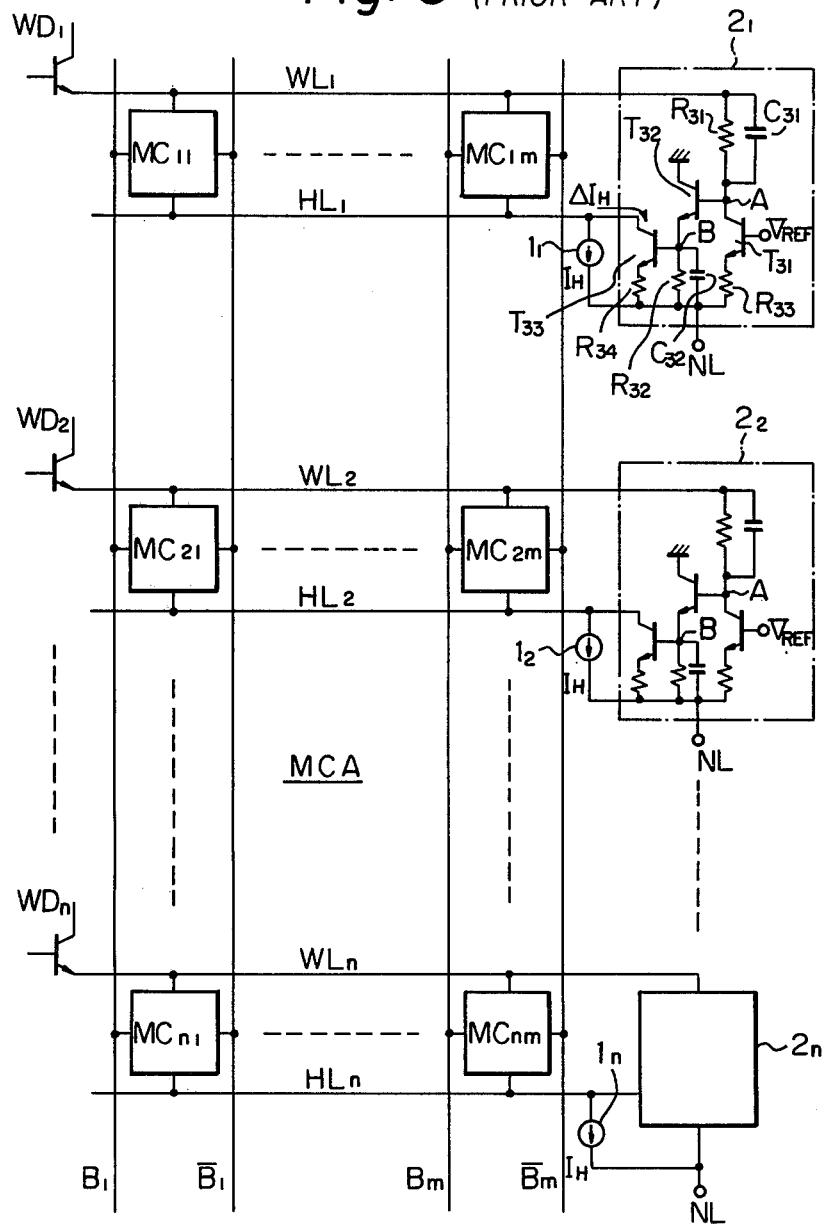
FIG. 3 is a block circuit diagram illustrating a memory device having other conventional termination circuits.
Figure 5:
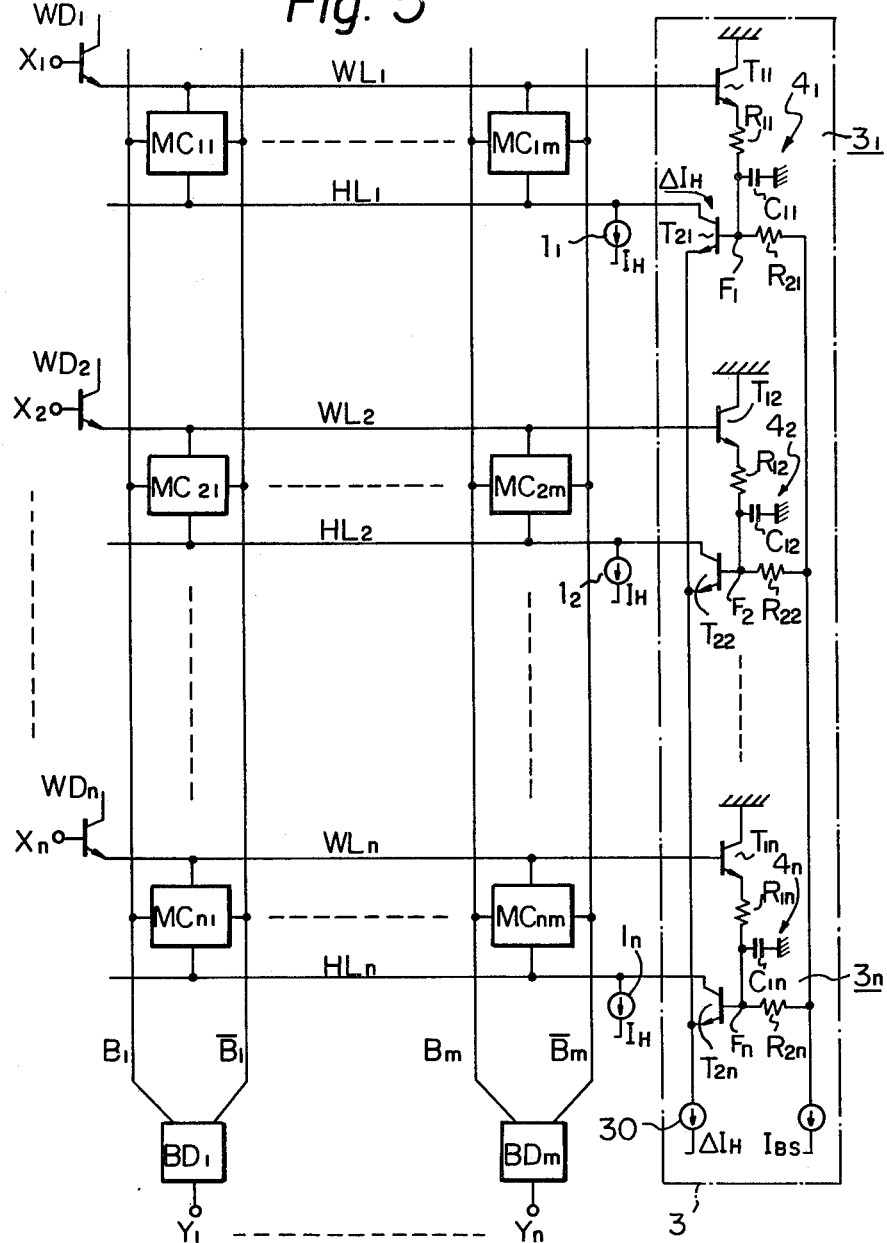
FIG. 5 is a block circuit diagram illustrating a memory device having a termination circuit according to the present invention.

FIG. 5 illustrates an embodiment of a memory device including a termination circuit in accordance with the present invention. The same parts appearing in FIG. 5 as appear in FIG. 1 or FIG. 3 are designated by the same reference symbols and an explanation thereof is omitted herein.

In FIG. 5, $X_1, X_2, \ldots, X_n$ designate word address signals which are applied to the word line drivers $WD_1$, $WD_2, \ldots, WD_n$, respectively, and each of which becomes high in the selected condition. $Y_1, Y_2, \ldots, Y_m$ designate bit address signals which are applied to bit line drivers $BD_1, BD_2, \ldots, BD_m$, respectively, and each of which becomes high in the selected condition. One of the bit line drivers $BD_1, BD_2, \ldots, BD_m$ to which a high level bit address signal is applied turns on. The termination circuit 3, according to the present invention, comprises n termination circuit units $3_1$ through $3_n$, each of which is connected to end points of the corresponding one of the word lines $WL_1$ through $WL_n$ and of the corresponding one of the hold lines $HL_1$ through $HL_n$. Each of the termination circuit units $3_1$ through $3_n$ has the same structure, and therefore, only the termination circuit unit $3_1$ connected to the word line $WL_1$ and the hold line $HL_1$ will now be explained. The termination circuit unit $3_1$ comprises: a first NPN type transistor $T_{11}$, which operates as an emitter follower having a base electrode connected to the word line $WL_1$; a delay circuit $4_1$, which delays an output signal from the transistor $T_{11}$ and which consists of a resistor $R_{11}$ and a capacitor $C_{11}$; a second NPN type transistor $T_{21}$, which receives an output signal from the delay circuit $4_1$, having a collector electrode connected to the hold line $HL_1$ and having an emitter electrode connected commonly to a common hold current source 30; and a resistor $R_{21}$ connected between the base electrode of the transistor $T_{21}$ and the common bias current source $I_{BS}$. The resistors $R_{21}$ and $R_{11}$ and the common bias current source $I_{BS}$ determine a base bias potential for the transistor $T_{21}$. It should be noted that n NPN type transistors $T_{21}$ through $T_{2n}$ and the common hold current source 30 comprise a current switch.

Operation of the termination circuit 3 in FIG. 5 will now be described. When the word line, for example, $WL_1$ changes from the selected condition to the non-selected condition or from the non-selected condition to the selected condition, the potential of the word line $WL_1$ changes from high level, for example $-0.9$ V, to low level, for example $-1.7$ V, or from low level to high level, respectively. Such a potential change is transferred, after a short time delay, to the base electrode of the transistor $T_{21}$ by the transistor $T_{11}$ and the delay circuit $4_1$ with the length of the time delay determined by a time constant $R_{11} \cdot C_{11}$.

Figure 6:
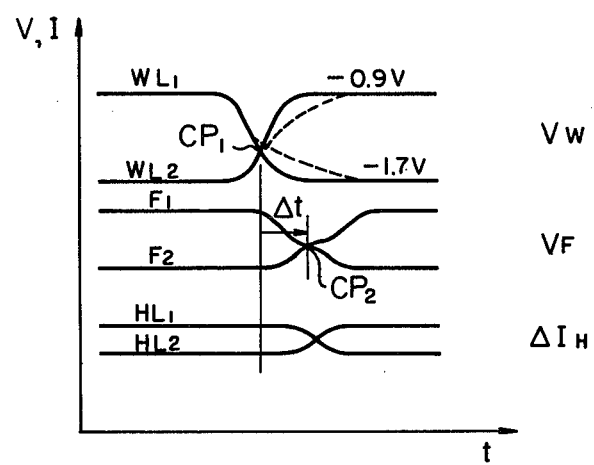
FIG. 6 is a timing diagram illustrating signals appearing in the memory device of FIG. 5.

Assuming that the word line, for example $WL_1$, has been previously selected and is changing from the selected condition to the non-selected condition, and another word line, for example $WL_2$, has been selected after the word line $WL_1$ and is changing from the non-selected condition to the selected condition, the potential $V_W$ of the word line $WL_1$ changes from high to low and the potential $V_W$ of the word line $WL_2$ changes from low to high as illustrated graphically in FIG. 6. A potential $V_F$ of point $F_1$, that is, the output of the delay circuit $4_1$ changes from a relatively high level to a relatively low level after a short time delay relative to the potential change in word line $WD_1$, and the potential $V_F$ of point $F_2$, that is, the output of the delay circuit $4_2$ changes from a relatively low level to a relatively high level after a short time delay relative to the potential change in word line $WD_2$ as shown in FIG. 6. Therefore, cross point $CP_2$ of the potentials of the points $F_1$ and $F_2$ is later than cross point $CP_1$ of the potentials of the word lines $WL_1$ and $WL_2$ by a delay time $\Delta t$, which is determined by the time constant $R_{11} \cdot C_{11}$. Practical experiments have shown that the delay time $\Delta t$ amounts to about 4 ns in the condition of $C_{11} = 1 pF$, $R_{11} = R_{21} = 5$ K$\Omega$ and the delay time can be set to any value by selecting values of the capacitor $C_{11}$ and the resistors $R_{11}$ and $R_{21}$. Since the transistors $T_{21}$ through $T_{2n}$ compose the current switch, only the one of the transistors $T_{21}$ through $T_{2n}$ which has the highest base potential is turned on at any one time. Therefore, until the cross point $CP_2$ is reached, the transistor $T_{21}$ is in the turned on condition and the additional current $\Delta I_H$ flows from the hold line $HL_1$ through the transistor $T_{21}$ to the common hold current source 30, and after the cross point $CP_2$ the transistor $T_{22}$ is turned on and the additional current $\Delta I_H$ flows from the hold line $HL_2$ through the transistor $T_{22}$ to the common hold current source 30.

Since the additional current $\Delta I_H$ continues to flow through the hold line $HL_1$ until a short time after the word line $WL_1$ has changed from the selected condition to the non-selected condition, the fall time of the potential of the word line $WL_1$ is reduced. Since the additional current $\Delta I_H$ does not flow through the hold line $HL_2$ immediately after the word line $WL_2$ has changed from the non-selected condition to the selected condition, excessive current does not flow from the word line driver $WD_2$ through the word line $WL_2$ to the hold line $HL_2$ at the transition period of the potential of the word line $WL_2$ from low to high, so that the rise time for the potential of the word line $WL_2$ is reduced.

In the above described embodiment, the common bias current source $I_{BS}$, which is common to a plurality of termination circuit units $3_1$ through $3_n$, is used. However, it is also possible to use a plurality of bias current sources, each of which is connected to the base electrode of one of the transistors $T_{21}$ through $T_{2n}$ respectively.

According to the present invention, the switching point of the additional current $\Delta I_H$ is delayed from the switching point of the word line potential $V_W$ by using the delay circuit comprising, for example, the resistor $R_{11}$ and the capacitor $C_{11}$, so that both the rise time and the fall time of the word line potential can be reduced. Since the bias current $I_{BS}$ can be decreased to a relatively small value without affecting the operation of the termination circuit, the resistance value of the resistors $R_{11}$ and $R_{21}$ can be increased so that a large delay time can be obtained. Therefore, the capacitance of the capacitor $C_{11}$ can be decreased so that the area occupied by the capacitor $C_{11}$ can be very small. In addition, the termination circuit, according to the present invention, uses a small number of circuit parts, each of the termination circuit units using only one capacitor, for example $C_{11}$, so that the entire termination circuit occupies a relatively small area in the integrated circuit of a memory device.

I claim:

1. A termination circuit, for word lines of a semiconductor memory device having a plurality of memory cells, operatively connected between the word lines and hold lines, the word lines selected by word address signals applied to the semiconductor memory device, the word lines driven to different first or second potential levels with respect to a reference voltage in dependence upon the selected or non-selected condition of the word lines, each hold line having a hold line current source operatively connected thereto, comprising:

first transistors, each operatively connected to one of the word lines, each detecting a potential change of one of the word lines with respect to the reference voltage, and each generating a detected output signal when a change in the word line potential with respect to the reference voltage occurs;

delay circuits, each operatively connected to one of said first transistors, respectively, for delaying the detected output signal of the one of said first transistors to which the selected word line is connected for a predetermined period and for generating a delayed detected output signal;

second transistors, each having an emitter, a base operatively connected to one of said delay circuits, respectively, and a collector operatively connected to one of the hold lines, respectively, and each turned on and off by the delayed detected output signal from one of said delay circuits, respectively; and a common hold current source for the hold lines, operatively connected to the emitter of said second transistors, and each of said second transistors and said common hold current source forming a current switch.

2. A termination circuit as set forth in claim 1, wherein each of said first transistors has an emitter electrode, wherein each of said second transistors has a base electrode, and wherein each of said delay circuits comprises:

a first resistor operatively connected between the emitter electrode of one of said first transistors and the base electrode of one of said second transistors; and a capacitor operatively connected between the base electrode of one of said second transistors and the reference voltage.

3. A termination circuit as set forth in claim 1 or 2, wherein each of said second transistors has a base electrode, and wherein said termination circuit further comprises:

second resistors each having a first terminal and a second terminal operatively connected to the base electrode of a respective one of said second transistors; and a common bias current source operatively connected to the first terminals of each of said second resistors.

4. A termination circuit as set forth in claim 1 or 2, wherein each of said transistors has a base electrode, and wherein said termination circuit further comprises:

second resistors each having a first terminal and a second terminal operatively connected to the base electrode of a respective one of said second transistors; and common bias current sources each operatively connected to the first terminal of a respective one of said second resistors.

5. A termination circuit for a semiconductor memory device having a plurality of memory cells, each of the memory cells having a word line and a hold line, each hold line having a hold line current source attached thereto, each of the word lines selected by word address signals applied to the semiconductor memory device, each of the word lines driven to different first or second potential levels with respect to a reference voltage in dependence upon the selected or non-selected condition of the word line, said termination circuit comprising:

a common hold current source; and termination units each operatively connected to the respective word line and the respective hold line, and each operatively connected to said common hold current source, each termination unit comprising:

potential change detection means, operatively connected to the respective word line of the semiconductor memory device, for detecting a change in the potential of the word line with respect to the reference voltage and for generating a detected output signal whenever a potential change in the word line occurs;

signal delay means, operatively connected to said potential change detection means, for delaying the detected output signal produced by the potential change detection means and for generating a delayed detected output signal; and current switching means, operatively connected to said signal delay means, a respective hold line and said common hold current source, for switching current from the hold line, said current switching means actuated by the delayed detected output signal received from said signal delay means, whereby when a word line changes from the selected condition to the non-selected condition, the current flowing through the memory cell from the word line to the hold line continues for a delay period, resulting in reduced fall time for the non-selected word line.

6. A termination circuit as set forth in claim 5, wherein said potential change detection means comprises a first transistor.

7. A termination circuit as set forth in claim 5, wherein said signal delay means comprises:

a first resistor operatively connected to said potential change detection means; and a capacitor operatively connected between said first resistor and the reference voltage.

8. A termination circuit as set forth in claim 5, 6 or 7, wherein said current switching means comprises:

a second transistor operatively connected to said first transistor of said signal delay means, the respective hold line and said common hold current source; and a second resistor operatively connected to said second transistor.

9. A termination circuit as set forth in claim 8, wherein said termination circuit further comprises bias current sources, one of said bias current sources operatively connected to said second resistor of the respective one of said termination units.

10. A termination circuit as set forth in claim 8, wherein said termination circuit further comprises a common bias current source operatively connected to each second resistor of each of said termination units.

* * * * *

UNITED STATES PATENT AND TRADEMARK OFFICE
CERTIFICATE OF CORRECTION

PATENT NO. : 4,370,736
DATED : January 25, 1983
INVENTOR(S) : Takahashi

It is certified that error appears in the above—identified patent and that said Letters Patent is hereby corrected as shown below:

Column 1, line 42, "resisters" should be --resistors--;
Column 1, line 54, "hole" should be --hold--;
Column 1, line 64, "$B_1$" should be --$\overline{B}_1$--.
Column 2, line 25, "read out" should be --read-out--;
Column 2, line 29, "read out" should be --read-out--;
Column 2, line 31, "read out" should be --read-out--.
Column 3, line 36, delete "and";
Column 3, line 58, "," (first occurrence) should be --;--.
Column 4, line 58, after "period" insert --;--.
Column 6, line 12, "A" should be --The--.
Column 8, line 2, after "said" insert --second--.

Signed and Sealed this

Sixteenth Day of August 1983

[SEAL]

Attest:

GERALD J. MOSSINGHOFF

Attesting Officer    Commissioner of Patents and Trademarks